United States Patent
Lee (10) Patent No.: US 7,830,162 B2
(45) Date of Patent: Nov. 9, 2010

(54) VERTICAL PROBE AND METHODS OF FABRICATING AND BONDING THE SAME

(75) Inventor: Oug-Ki Lee, Gasan-dong, 60-29, Geumcheon-gu, Seoul 153-801 (KR)

(73) Assignees: Phicom Corporation, Seoul (KR); Oug-Ki Lee, Seoul (KR)

( * ) Notice: Subject to any disclaimer, the term of this patent is extended or adjusted under 35 U.S.C. 154(b) by 164 days.

(21) Appl. No.: 11/989,940

(22) PCT Filed: Jul. 19, 2006

(86) PCT No.: PCT/KR2006/002830
§ 371 (c)(1),
(2), (4) Date: Feb. 4, 2008

(87) PCT Pub. No.: WO2007/015600
PCT Pub. Date: Feb. 8, 2007

(65) Prior Publication Data
US 2009/0174421 A1    Jul. 9, 2009

(30) Foreign Application Priority Data
Aug. 3, 2005   (KR) ............... 10-2005-0071115

(51) Int. Cl.
*G01R 31/02* (2006.01)
(52) U.S. Cl. ................................. 324/754
(58) Field of Classification Search ............ None
See application file for complete search history.

(56) References Cited

U.S. PATENT DOCUMENTS

| | | | | |
|---|---|---|---|---|
| 6,328,902 | B1 * | 12/2001 | Hantschel et al. | 216/2 |
| 6,677,245 | B2 * | 1/2004 | Zhou et al. | 438/708 |
| 7,315,505 | B2 * | 1/2008 | Adelmann | 369/126 |
| 7,500,387 | B2 * | 3/2009 | Fouchier | 73/105 |
| 2005/0184748 | A1 * | 8/2005 | Chen et al. | 324/761 |
| 2006/0171425 | A1 | 8/2006 | Lee et al. | |
| 2006/0192581 | A1 | 8/2006 | Lee | |
| 2009/0151030 | A1 * | 6/2009 | Fouchier | 850/33 |
| 2009/0155724 | A1 * | 6/2009 | Jo | 430/312 |

FOREIGN PATENT DOCUMENTS

| | | |
|---|---|---|
| JP | 04-216470 | 8/1992 |
| JP | 09-219267 | 8/1997 |
| JP | 2000-329789 | 11/2000 |

(Continued)

OTHER PUBLICATIONS

English language abstract of Korean Patent Publication No. KR 1020040000111, Jan. 3, 2004.

(Continued)

*Primary Examiner*—Jermele M Hollington
(74) *Attorney, Agent, or Firm*—Harness, Dickey & Pierce, P.L.C.

(57) ABSTRACT

Disclosed is a vertical probe and methods of fabricating and bonding the same. The probe is comprised of a contactor equipped with two tips, a connector electrically linking with a measuring terminal of a measurement system, And a bump connecting the contactor to the connector and buffing physical stress to the contactor.

5 Claims, 10 Drawing Sheets

FOREIGN PATENT DOCUMENTS

| | | |
|---|---|---|
| JP | 2002-062314 | 2/2002 |
| JP | 2002-162418 | 6/2002 |
| KR | 1020020022130 | 3/2002 |
| KR | 1020040000111 | 1/2004 |
| KR | 1020040003735 | 1/2004 |
| KR | 100446551 | 8/2004 |
| KR | 20-0372710 | 1/2005 |

OTHER PUBLICATIONS

English language abstract of Korean Patent Publication No. KR 100446551, Aug. 23, 2004.

* cited by examiner

VERTICAL PROBE AND METHODS OF FABRICATING AND BONDING THE SAME

This application claims priority from PCT International Application No. PCT/KR2006/002830 filed on Jul. 19, 2006, which claims priority to KR 2006-0071115, filed on Aug. 3, 2005.

TECHNICAL FIELD

The present invention is concerned with probes of electronic device test systems, which in particular relates to probes for testing electrical characteristics by contacting to pads of microscopic electronic devices and methods of fabricating and boding the same.

BACKGROUND ART

Probes are mechanical tools for measuring electrical characteristics of microscopic electronic devices (e.g., semiconductor devices). As well known, a semiconductor device has pluralities of pads for communicating signals with an external electronic system. The semiconductor device processes an operation with electrical signals that are input through the pads and then transfers a processed result to an external system through the pads. During this, the probes are arranged on a printed circuit board of a probe card, physically contacting with the pads, so they form electrical paths for signal transmission with the external device or system.

Meanwhile, with higher integration density in semiconductor devices, the pads become narrower in interval and smaller in size. Since the probes should be formed to contact physically with the pads, the change of pad structure, which is required by the increase of integration density, causes technical difficulties relevant to structure and arrangement of the probes. For example, the probes have to be arranged with assuring the minimum interval so as to prevent electrical interference and short-circuit between them.

In order to reduce contact resistance between pads and probes, an over-drive contacting scheme should be used to connect the probes with the pads. (Here, the over-drive contacting scheme is a connecting method in which a pressure beyond a required magnitude is applied to the probes.)

However, since a contact pressure in the over-drive contacting scheme results from a distortion of the probes and a resultant restoring force, a repetition of over-drive contacts may cause permanent deformation in shape of the probes. Such deformation of the probes may reduce the restoring force of the probe or cause a variation of arrangement of the probes. To lessen these problems, the probes are required of having sufficiently large restoring force.

Figure 1:
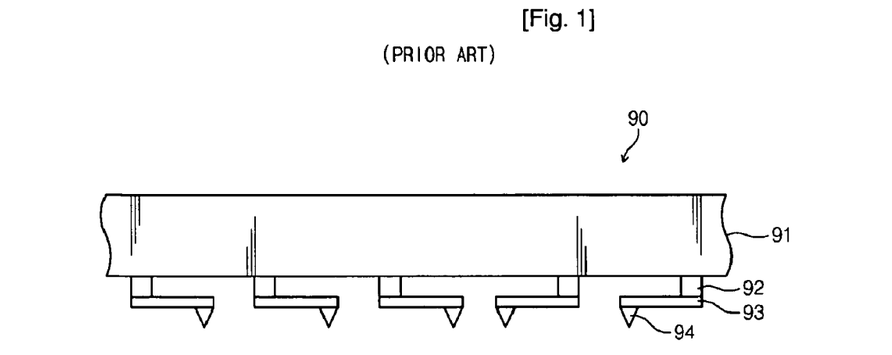
FIG. 1 is a sectional view partially showing a conventional probe card.

According to prior arts, a cantilever-type probe card has been proposed in order to enhance the restoring force of probe. (See FIG. 1.) In the cantilever-type probe card 90, bumps 92 arranged on a substrate 91 are bonded to one ends of supporting beams 93. Tips 94, which are contacted directly with pads of an electronic device, are bonded to the other ends of the supporting beams 93. In the meantime, the tips 94 contact to the pads under pressure, and the supporting beams 93 need to have restoring force by elasticity. At this time, a length of supporting beam 93 should be sufficiently long, for a required restoring force. If a length of supporting beam is insufficient, the elasticity of supporting beam 93 is too weak to offer a sufficient restoring force.

Therefore, supporting beams for the cantilever-type probe card should have a sufficient length, and a distance between the bumps, which are bonded to the supporting beams, should be increased to satisfy the requirement related to the length of supporting beam.

In addition, it needs to minimize an interval between probes of the probe card for inspecting the highly integrated semiconductor devices of today.

DISCLOSURE OF INVENTION

Technical Problem

However, there are difficulties in minimizing the interval between the cantilever-type probes, because their supporting beams should have a sufficient length for assuring the required restoring force. Further, since the cantilever-type probe card is fabricated in the manner of bonding the tips 94 to the supporting beams 93, it is hard to maintain precisely the overall horizontality and to make lengths of probes uniform.

Additionally, an arrangement way of the pads is changing from one dimensional arrangement (e.g., a line type) to two dimensional arrangement (e.g., a matrix type) in accordance with increase of integration density of semiconductor device. However, the cantilever-type probe card is unsuitable for the two dimensional arrangement, because occupying area of the supporting beams and an interval between them are large.

Technical Solution

The present invention is directed to provide a probe occupying a smaller area to be suitable for higher integrating density of a semiconductor device.

The present invention also provides a probe having sufficient restoring force.

The present invention further offers a probe easy to maintain overall horizontality thereof.

The present invention still further provides a method of fabricating a probe having uniform length.

In order to achieve the technical directions, the invention provides a probe including two split tips. The probe comprises a contactor including two tips that contact with a measure target, a connector electrically connected to terminal of the measure target, and a bump linking the contactor with the connector and buffing physical stress acting on the contactor.

Here, the contactor, the connector, and the bump may be formed in a body. A distance from the tip to a central axis of the bump may be constant or larger as being close to the measure target from the bump. The two tips are split from the bump, being formed in shape of U, for offering restoring force against external force due to contact with the measure target.

According to embodiments of the invention, the contactor, the connector, and the bump are same in thickness. The widths of the contactor and the bump may be smaller than the thicknesses of the contactor and the bump. The connector may be comprised of a plug to be inserted into the terminal of the measure target. Here, the plug may be a hollow-type to provide restoring force thereto so as to be fixedly inserted into the terminal of the measure target. And, the connector may be comprised of at least a guide support spaced from the tips.

In addition, the bump may be configured in a staggered-type structure or a hollow-type structure so as to buffing physical stress to the contactor.

In order to achieve another technical direction, the invention provides a method of fabricating probes by using a patterning process including a photolithography and etching step. The method is comprised of forming a sacrificial film and a molding film in sequence on a substrate, patterning the molding film to form a molding pattern that defines shapes of the probes and has openings to disclose top faces of the sacrificial film, forming a conductive film to fill the openings, forming the probes to fill the openings by etching the conductive film until disclosing the top face of the molding film, and removing the molding pattern and the sacrificial film in sequence to lift off the probes. During this, each of the openings defines the probe in the shape including a connector, a bump, and two tips split from the bump.

Advantageous Effects

By providing a probe with the couple of tips split from the bump thereof, the probe is able to contact to a measure target effectively in stability. Further, the bump included in the probe is helpful for lessening physical stress acting on the tips. In addition, contrary to the conventional cantilever probe card, the probe according to the invention is bonded vertically to a bump such that its center of gravity is positioned on the vertical line passing the bump. Thus, the probe according to the present invention occupies a smaller area in a probe card, which is advantageous to testing a highly integrated semiconductor device (e.g., a semiconductor having two-dimensional arrangement of pads like a matrix).

BEST MODE FOR CARRYING OUT THE INVENTION

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention.

It will be understood that when a layer is referred to as being "on" another layer or substrate, it can be directly on the other layer or substrate, or intervening layers may also be present. Also, in the drawings, the thicknesses of layers and regions are exaggerated for clarity. It will also be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed could be termed a second element, component, region, layer or section without departing from the teachings of the present invention. Each embodiment described and illustrated herein includes its complementary embodiment as well.

Figure 2:
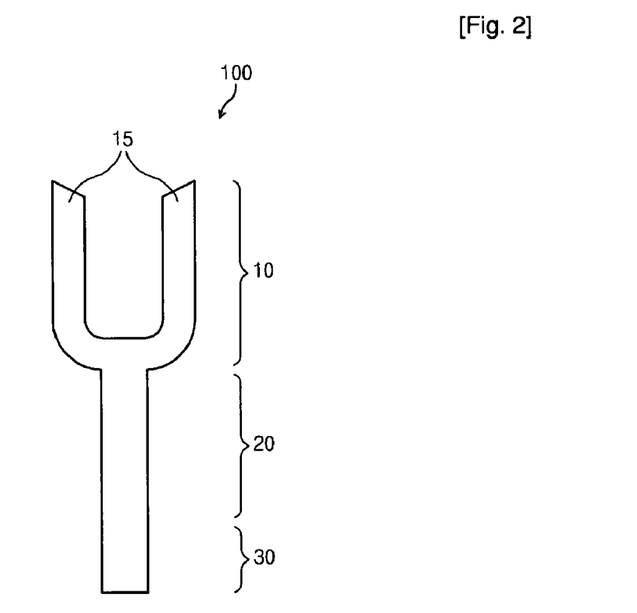
FIG. 2 is a plane view illustrating a vertical probe in accordance with an embodiment of the invention.
Figure 3:
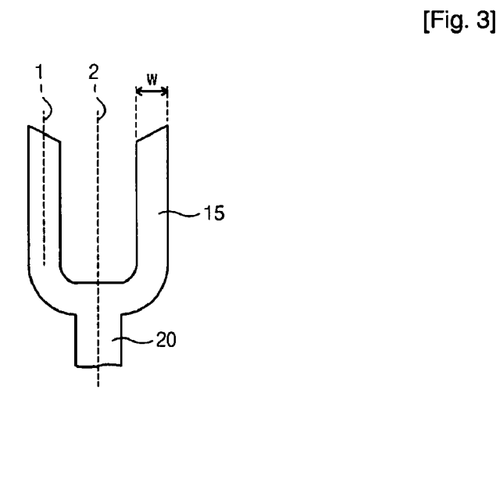
FIGS. 3 through 8 are plane views illustrating contactors of probes in accordance with embodiments of the invention.

FIG. 2 is a plane view illustrating a vertical probe in accordance with an embodiment of the invention.

Referring to FIG. 2, the probe 100 according to the embodiment of the invention comprises a contactor 10, a bump 20, and connector 30. The contactor 10 has tips 15 physically contacting with a target (e.g., pads of a semiconductor device) to be measured. The bump 20 functions for buffing physical stress to the tips 15 contacting with the measure target, preventing the tips 15 from being transformed beyond an elastic limit. The connector 30 is connected to a measurement terminal of external measurement equipment by means of interconnections formed in a probe card.

MODE FOR THE INVENTION

Figure 7:
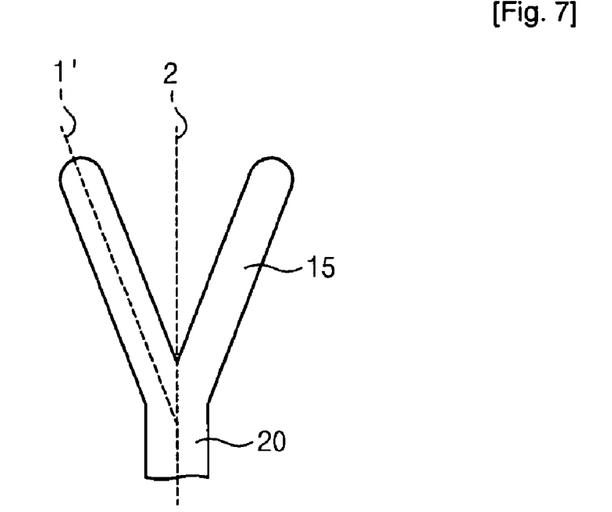
Figure 8:
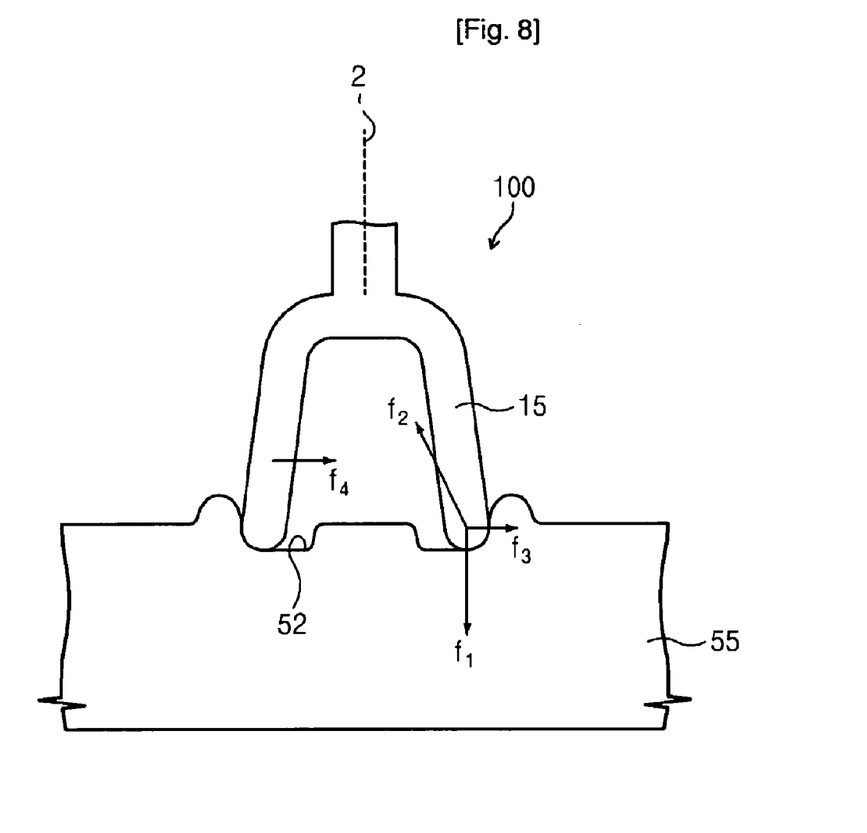
Figure 9:
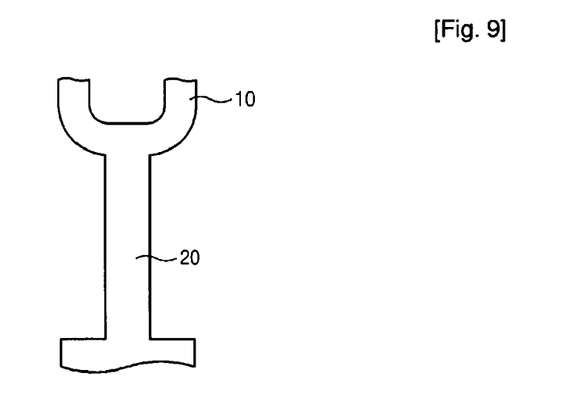
FIGS. 9 through 11 are plane views illustrating bumps of probes in accordance with embodiments of the invention.
Figure 10:
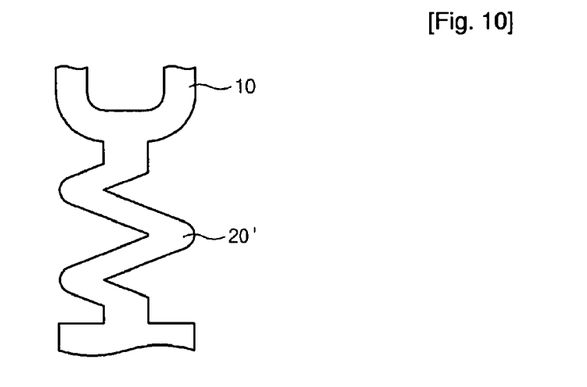
Figure 11:
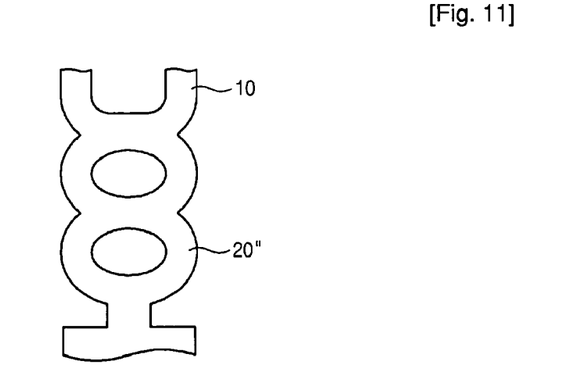

According to the invention, the shapes of the contactor 10, the bump 20, and the connector 30 may be variable as the occasion demands. FIGS. 3 through 8 are plane views illustrating various shapes of the contactor 10 in accordance with embodiments of the invention. FIGS. 9 through 11 are plane views illustrating various shapes of the bump 20 in accordance with embodiments of the invention. FIGS. 12 through 16 are plane views illustrating various shapes of the connector 30 in accordance with embodiments of the invention.

Referring to FIGS. 3 through 8, the contactor 10 is comprised of two tips 15 split from the bump 20. This split makes the tips 15 shaped in the form of 'U'. According to embodiments of the invention, the extending direction 1 of the tips 15 are parallel with the central axis 2 of the bump 20. In other words, a distance between the tips 15 and the central axis 2 of the bump 20 is constant. In addition, the tips 15 are symmetrically disposed to the central axis 2.

Figure 4:
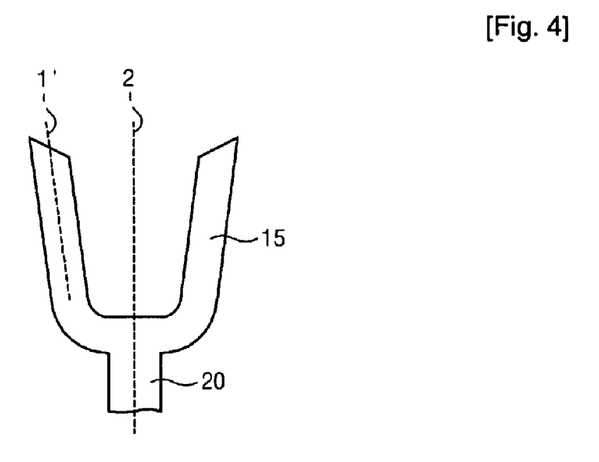

According to other embodiments by the invention, the tips 15 are spaced more apart from the central axis 2 as being distant from the bump 20. That is, as illustrated in FIGS. 4 and 7, an extending direction 1' of the tips 15 may form a predetermined acute angle with the central axis 2. As a result, the contactor 10 and the bump 20 may be constructed in the shape of 'Y' approximately. Specifically, as shown in FIG. 7, the tips according to the invention may be configured in the shape of 'V' that is different from the shape of 'U'.

Meanwhile, the ends of the tips 15 (i.e., portions contacting with a measure target) may be configured in angular corners. Concretely, the ends of the tips 15 may have corners that form acute and obtuse angles to the extending direction 1 or 1' of the tips 15. A curvature radius of each corner is sufficiently smaller than a width w of the tip 15 by $1/10$ through $1/10000$. According to embodiments of the invention, an interval between the acute corners is larger than an interval between the obtuse corners. Thus, when the tips 15 contact with a measure target that has the surface with uniform height, the acute corners contact with the surface of the measure target earlier than the obtuse corners. If an angle of contacting corner is acute, pressure brought by a measuring process is concentrated thereon. Thereby, scratches, which may reduce contact resistance, may be formed on the surface of the measure target.

Figure 5:
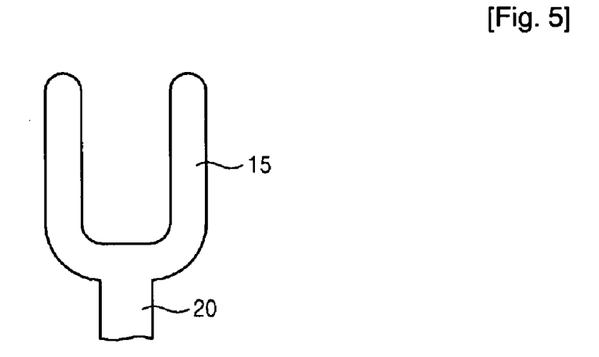

On the other hand, during such an over-drive contacting operation, the tips 15 may be distorted by being over-pressed beyond the elastic limit. In order to prevent the distortion, the corners of the tips 15 may be variable in angle and curvature radius. For instance, as illustrated in FIG. 5, the tips 15 may have round ends.

According to the invention, the tips 15 may have restoring force during the over-drive contacting operation. The restoring force may be brought from various structural configurations of the tips 15. For example, while contacting to the measure target, the tips 15 would be distorted in the direction perpendicular to the measure target (i.e., to the central axis 2). In this case, the ends of the tips 15 would be gradually distant from the central axis 2 while contacting to the measure target. In more detail, as shown in FIG. 8, if the tips 15 are contacted to the pad 55, force $f_1$ acting on the pad 55 by the tips 15 results in a reaction force $f_2$ acting on the tips 15 by the pad 55 and results in a distortion force $f_3$ that makes the ends of the tips 15 be apart from the central axis 2. As a result, scrub marks are formed on the pad 55. After then, if the tips 15 are detached from the pad 55, a restoring force $f_4$ is acted on the outstretched tips 15. As a result, the tips 15 are restored to their original forms before the contact operation. According to the invention, since the probe 100 contacts with the pad 55 by way of a couple of the tips 15, it is able to assure physical stability in contacting with the measure target. Especially, since the opposite distortion forces $f_3$ are acted on each of two tips 15, it is able to lessen the crosswise stress (i.e., the direction of the distortion force) applied to the probe 100.

Figure 6:
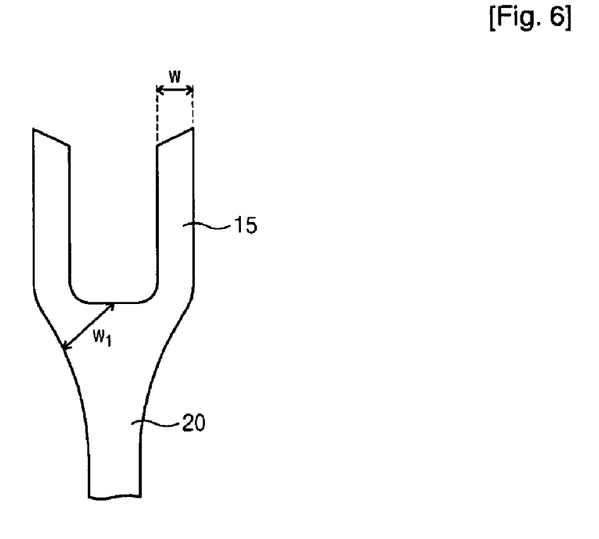

But, the repetitive contacts between the tips 15 and the pad 55 may result in degradation in restoring characteristics of the tips 15. In purpose of preventing this problem, a width $w_1$ where the tip 15 links with the bump 20 may be different from the width w of the tip 15. As illustrated in FIG. 6, the widths w and $w_1$ may satisfy the relation of $w_1 > w$.

Referring to FIGS. 9 through 11, the bump 20 lessens physical contact stress to the tips 15 as aforementioned. For this effect, the bump 20 is also configured to be capable of having a restoring force. For instance, the bump 20 may be configured in the shape of stick as shown in FIGS. 2 and 9. This stick-type bump 20 is suitable for contacting with a measure target (e.g., a metallic pad without an oxide film) that is not required to have an over-drive depth, because it does not have large restoring force.

According to other embodiments of the invention, the bump 20 may be configured in the shape of spring (i.e., in a staggered type) as illustrated in FIG. 10. As well known, since a spring has a higher elastic limit than a stick, the spring-type bump 20' offers a sufficiently large restoring force to the probe. Thereby, the spring-type bump 20' is able to minimize physical stress to the tips 15. Additionally, the stick-type bump accompanies with distortion perpendicular to the central axis 2, for the restoring force therein, but the spring-type bump 20' is operable with restoring force along the central axis 2 because its distortion is directed to the central axis 2. As like this, when the distortion of the bump 20 is oriented in parallel with the central axis 2, it is possible to minimize a rate of variation, which results from the over-drive contact operation, at the positions where the probes 15 are arranged.

According to still other embodiments of the invention, the bump 20 may be configured with hollow center portions as illustrated in FIG. 11. This hollow-type bump 20" is also advantageous to minimizing disposal variation of the probes because its restoring force works along the central axis 2 as like as the spring-type bump 20'. Additionally, since the hollow-type bump 20" links with the contactor 10 or the connector 30 through a wider area, it has smaller disposal variation against external crosswise force (i.e., perpendicular to the central axis 2) than the spring-type bump 20' does. The number of the hollow portions may be variable in need.

Figure 12:
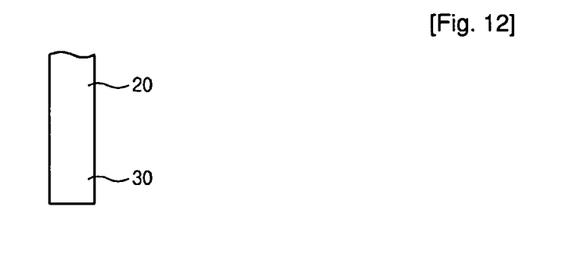
FIGS. 12 through 16 are plane views illustrating connectors of probes in accordance with embodiments of the invention.
Figure 13:
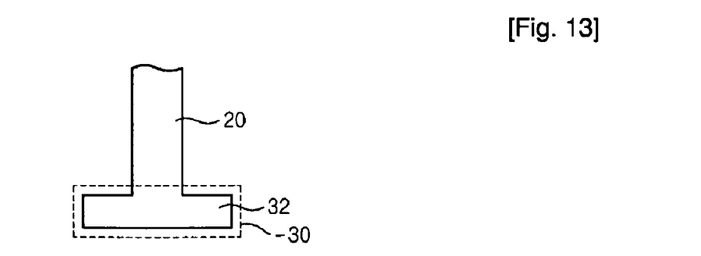
Figure 14:
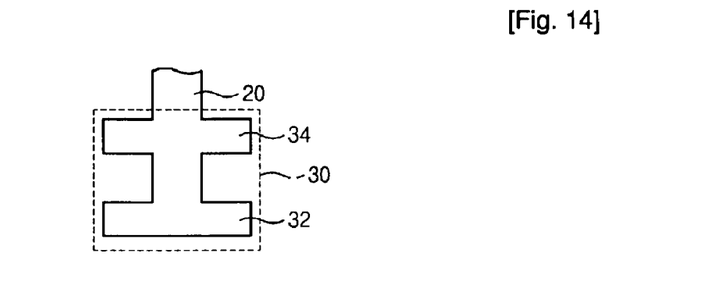
Figure 15:
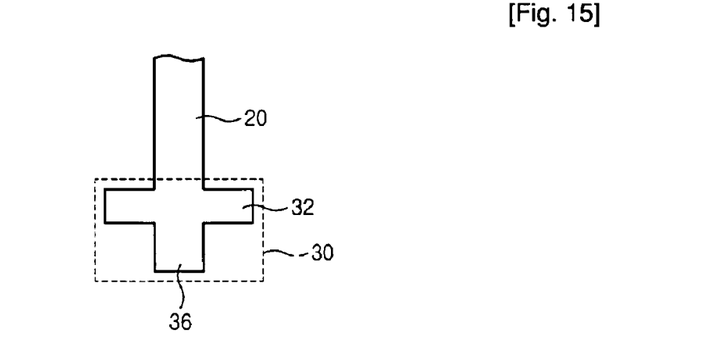
Figure 16:
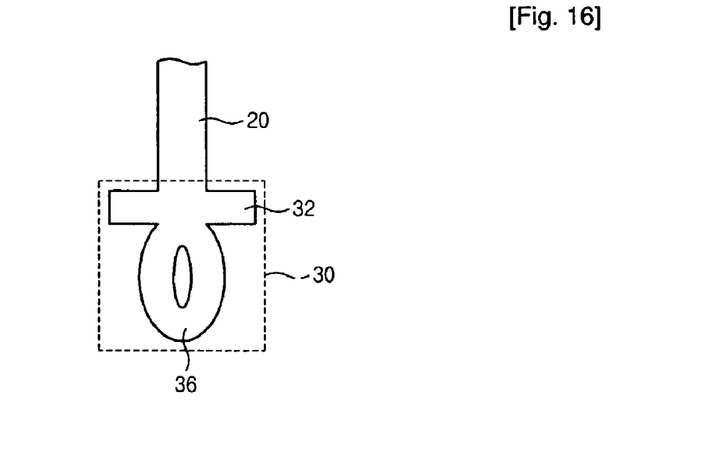

Referring to FIGS. 12 through 16, the connector 30 according to the invention comprises the stick type shown in FIG. 12, guiding support(s) 32 and/or 34 shown in FIGS. 13 through 16, or a plug 36 shown in FIGS. 15 and 16.

Figure 17:
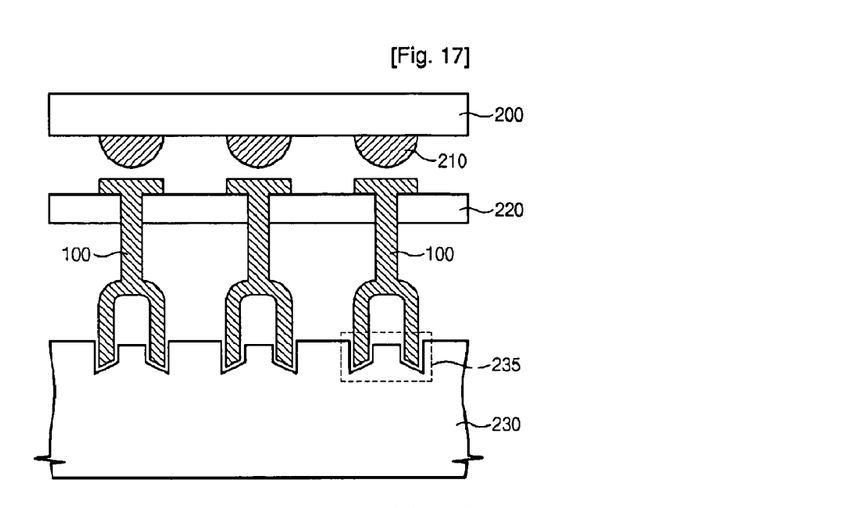
FIGS. 17 through 21 illustrate features of bonding the vertical probes in accordance with embodiments of the invention.
Figure 18:
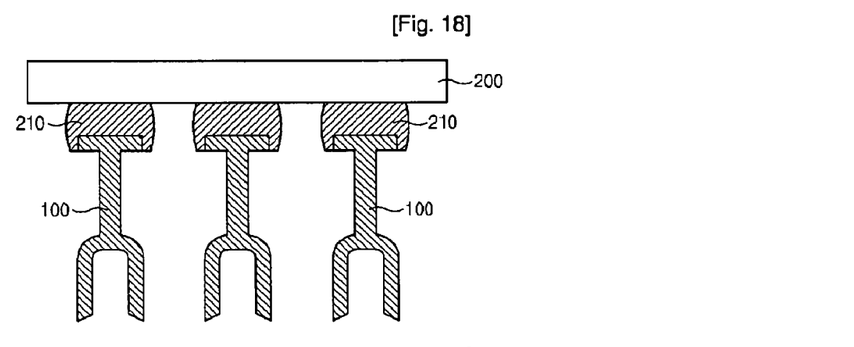

The guiding support 32 or 34 is useful for bonding the probes 100 to a substrate. In further detail, as illustrated by FIG. 17, the probes 100 are bonded thereto by way of soldering the connectors 30 to bumps 210 of the substrate 200. During this boding process, it is necessary to uniform the lengths of the probes 100 in order to regularize the distances from the substrate 200 to the ends of the tips 15. Since the guiding support 32 or 34 can be used as a reference for adjusting the lengths of the probes 100, it is easy to uniform the distances from the substrate 200 to the ends of the tips 15.

As illustrated in FIG. 14, the guiding supports 32 and 34 may be constructed in two stories spaced from each other by a predetermined interval. Such an interval between the guiding support 32 and 34 may be correspondent with a thickness of a top supporting plate 220 that is used for the soldering process. Further, for the uniformity of length and the facilitation of bonding, the invention may provide a bottom supporting plate 230 having aligned grooves 235 into which the contactors 10 are inserted.

Figure 19:
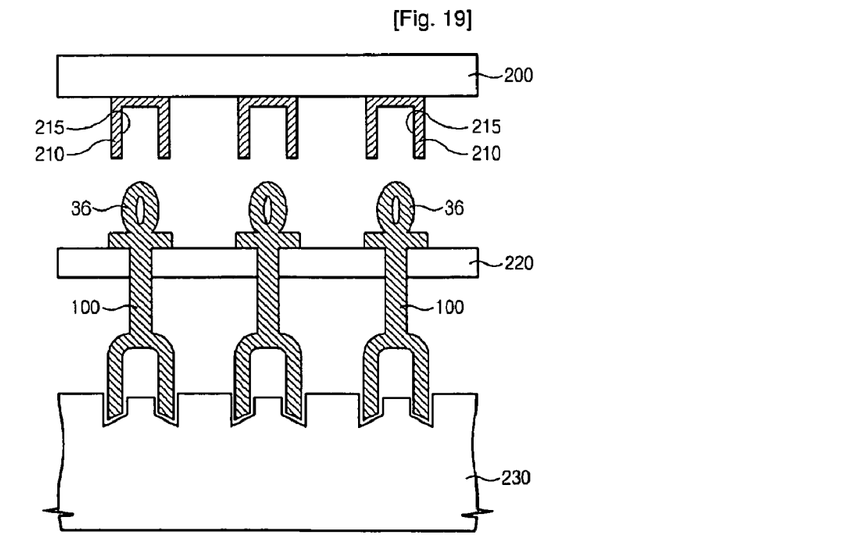
Figure 20:
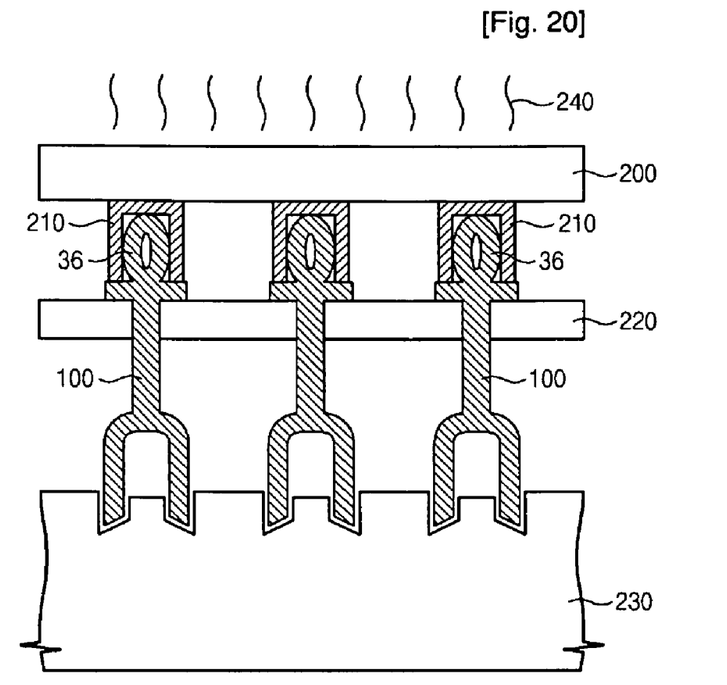
Figure 21:
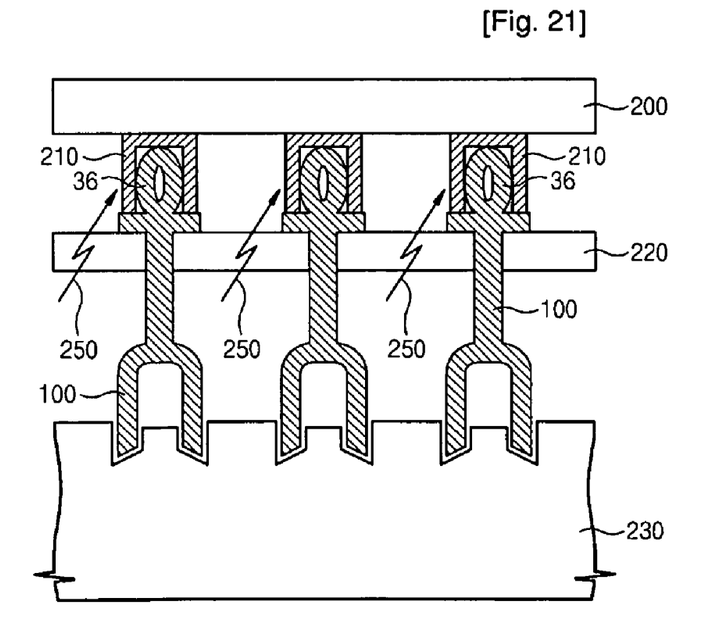

The plug 36 is inserted into the bump 210 of the substrate 200, contributing to stabilizing the boding condition of the probes 100. For this, each of the bumps 210, as shown in FIG. 19, is required to have a jointing groove 215 corresponding to the plug 36 of the probe 100. As can be seen from FIG. 16, the plug 36 configured in a hollow type can be easily inserted into the jointing groove 215 and stably fixed thereto rather than other type. In more detail, the probe 100 including the plug 36 is bonded to the substrate 200 by ways of inserting the plug 36 into the jointing groove 215 and melting/quenching the bump 210 (refer to FIGS. 17, 20, and 21). Melting the bump 210 may be accomplished through heating the substrate 200 entirely beyond the melting point of the bump 210 as shown in FIG. 20, or heating up the bumps 210 by means of laser beam as shown in FIG. 21. For this condition, the bumps 210 may be formed of gold, tin, lead, or an alloy containing them. And, the substrate 200 may be formed of a material (e.g., ceramic) capable of retaining its physical property even though the substrate 200 heats up to the melting point of the bump 210.

Meanwhile, forming the bumps 210 includes a step of depositing a bump film on the substrate 200 and then patterning the bump film by means of a photolithography and etching process. Thereby, the bumps 210 are arranged on the substrate 200 in the pattern of line or second dimensions. In addition, forming the jointing grooves 215 includes a step of patterning the bumps 210 on the substrate 200 by means of a photolithography and etching process. During this, it is preferred to regulate a width of the jointing grooves 215 in correspondence with a width of the plug 36 so as to minimize gaps with the plugs 36.

Figure 22:
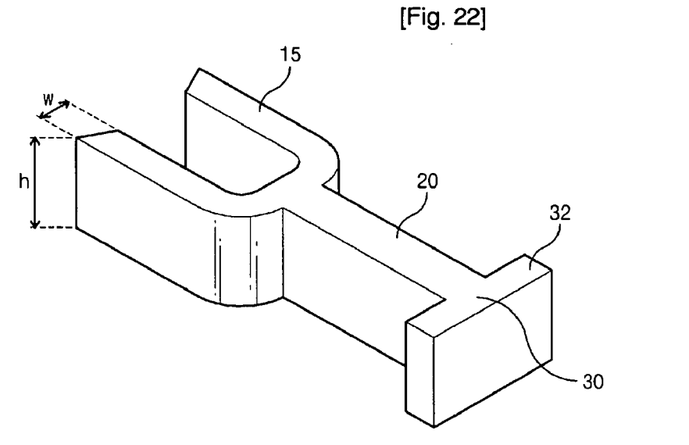
FIG. 22 is a perspective view illustrating a vertical probe in accordance with another embodiment of the invention.

FIG. 22 is a perspective view showing features relevant to measurements of the probe in accordance with the embodiments of the invention. Referring to FIG. 22, the probe by the invention may be formed with including the contactor 10, a bump 20, and a connector 30 in a body. The contactor 10, the bump 20, and the connector 30 may be same in thickness h. This feature by the invention will be obtained by the following processing method described later.

Meantime, considering that the restoring force is generated by physical distortion, it is necessary to control a pattern of the physical distortion of the probe 100 for providing the larger elastic limit and the maximum restoring force thereto. To do this, the thickness h of the probe 100 is preferred to be larger than the width w of the contactor 10 and the bump 20, satisfying the condition of w<h<20w. In this case, during the over-drive operation, the distortion of the tips 15 is restrictively oriented to the direction of width, not to the direction of thickness. Thereby, such directional restriction to the distortion is helpful to minimizing destruction of the probe due to inadvertent distortion toward a direction that does not assure sufficient restoring force.

FIGS. 23 through 25 and 26 through 29 are plane and sectional views illustrating processing steps of fabricating the vertical probe according to the invention. Here, FIGS. 26 through 29 show sections taken along with the dotted line I-I' of FIGS. 23 through 25.

Figure 23:
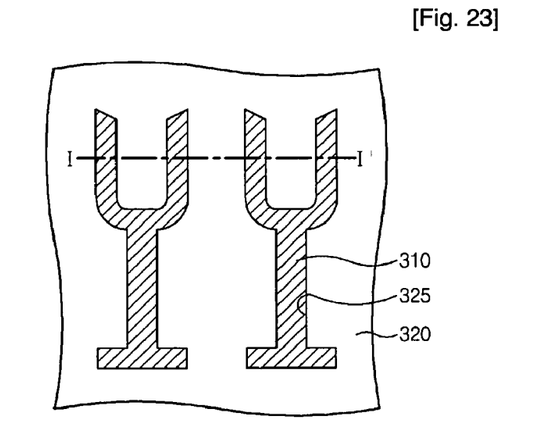
FIGS. 23 through 25 are plane views illustrating processing steps of fabricating the vertical probe according to the invention.
Figure 26:
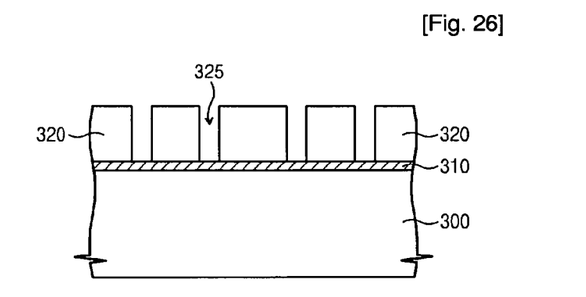
FIGS. 26 through 29 are sectional views illustrating processing steps of fabricating the vertical probe according to the invention.

Referring to FIGS. 23 and 26, a sacrificial film 310 and a molding film are formed in sequence on a substrate 300. The sacrificial film 310 may be made of a metallic material such as copper, while the molding film, as a material having etching selectively to the sacrificial film 310, may be made of photoresist, silicon oxide, silicon nitride, silicon oxynitride, or SOG. Continuously, the molding film is patterned to form openings 325, defining the shape of the probes. Thereby, it completes a molding pattern 320 to be used as a mold for making the probes.

During this, each probe is formed with including the contactor, the bump, and the connector, in which the contactor is patterned with having the two tips almost shaped in the form of 'U'. The detailed patterns of the probe are as proposed by those embodiments shown in FIGS. 2 through 22, so will not be further detailed about them.

Forming the molding pattern 320 is carried out with including a step of patterning the molding film by means of a photolithography and etching process that uses a photomask where the shapes of the probes 100 are inscribed. Further, according to an embodiment of the invention, the molding pattern 320 may be a photoresist pattern formed by the photolithography and etching (i.e., developing) process. During this, the molding pattern 320 disclosed the top faces of the sacrificial film 310 placed thereunder.

Figure 24:
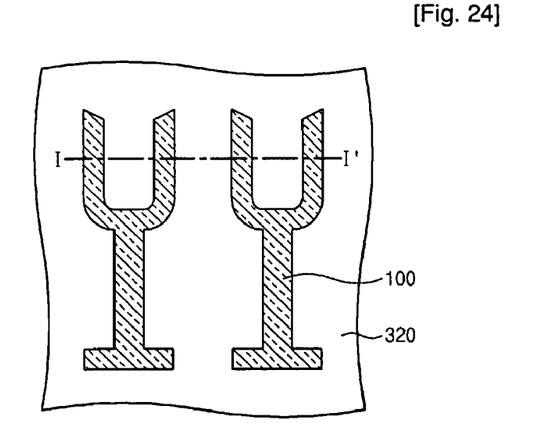
Figure 27:
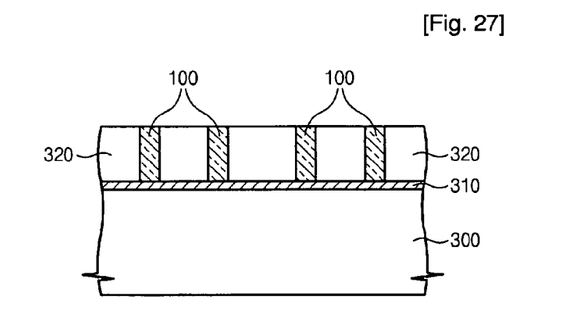

Referring to FIGS. 24 and 27, a conductive film is formed on the disclosed surfaces of the sacrificial film 310, filling the openings 325. Continuously, the conductive film is selectively etched to disclose the top faces of the molding pattern 320, forming the probes 100 in the openings 325. The conductive film is formed of a metallic material having etching selectivity to the sacrificial film 310 for dividing the subsequent probes 100. Etching the conductive film may be accomplished with including a step of flattening the conductive film by means of an etching recipe having etching selectivity to the molding pattern 320.

Figure 25:
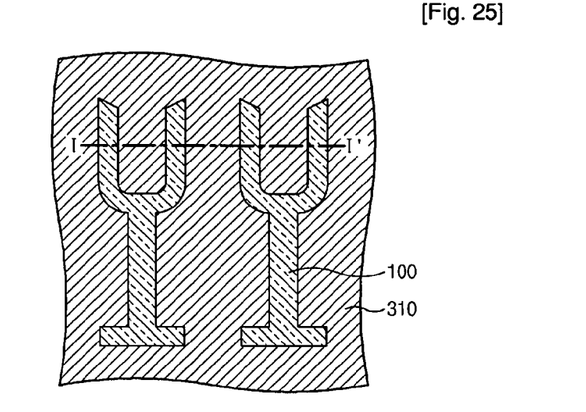
Figure 28:
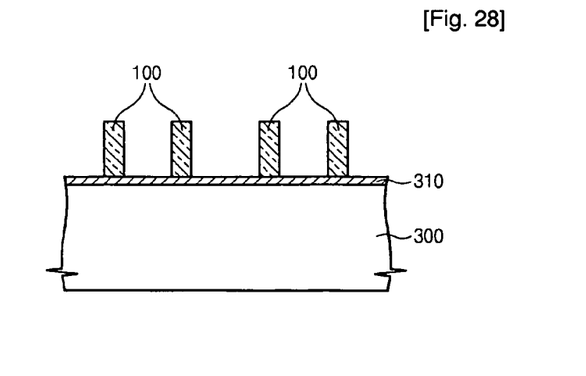
Figure 29:
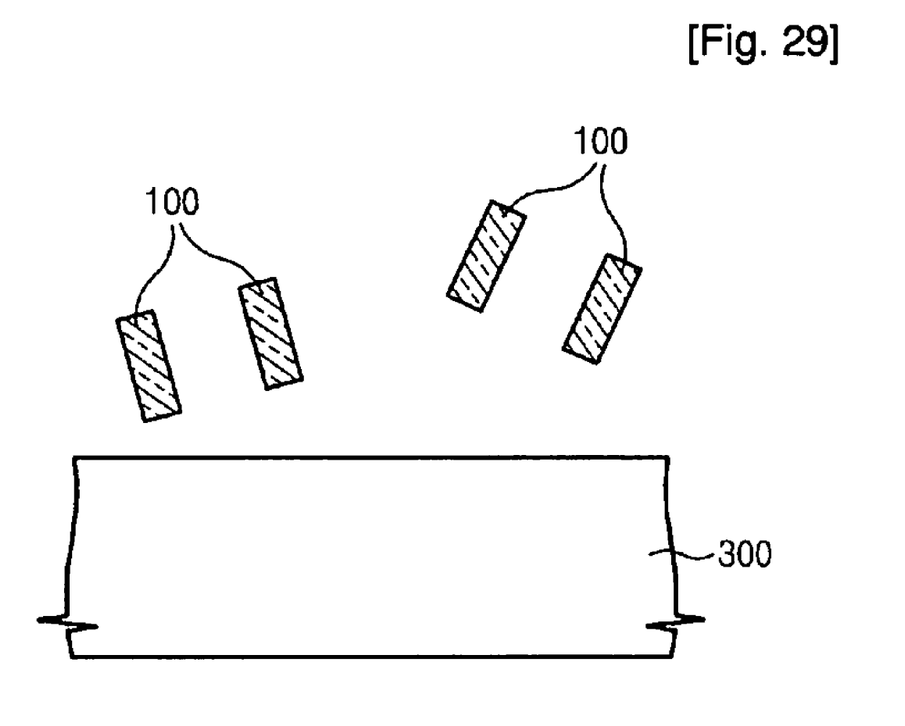

Referring to FIGS. 25 and 28, the disclosed molding pattern 320 is removed to the sacrificial film 310 placed thereunder. After then, illustrated in FIG. 29, the disclosed sacrificial film 310 is removed therefrom by means of a wet etching process with selectivity to the probes 100. As a result, the probes 100 disposed on the sacrificial film 310 are separated from the substrate 300.

INDUSTRIAL APPLICABILITY

The invention is applicable to testing microscopic electronic devices having pluralities of pads.

The invention claimed is:

1. A method of bonding vertical probes to terminals formed on a substrate, comprising:
    forming bumps with jointing grooves on the substrate;
    forming the probes that includes a contactor, a bump, and a connector having a plug;
    inserting the plugs of the probes into the jointing grooves; and
    molding the plugs and the bumps.

2. The method according to claim 1, wherein the bump is formed of at least one selected from nickel, cobalt, gold, and an alloy including at least one of nickel, cobalt, and gold.

3. The method according to claim 1, wherein forming the bumps comprises:
    forming a bump film on the substrate;
    patterning the bump film to form the bumps arranged on the substrate; and
    patterning the bumps to form jointing grooves in the bumps,
    wherein the forming of the bump film includes performing at least one method selected from electrical plating, sputtering, and chemical vapor deposition,
    wherein the patternings of the bump film and the bumps include performing photolithography and etching processes.

4. The method according to claim 1, wherein the molding of the plugs into the bumps includes bonding the probes, which are fixed by a predetermined guide panel, to the substrate,
    wherein the bonding of the probes and the substrate includes melting the bumps by using one of a heating of substrate or an irradiation of laser beam to the substrate.

5. The method according to claim 1, wherein the inserting of the plugs of the probes into the jointing grooves comprises:
    inserting the contactors of the probes into a bottom supporting plate so as to temporarily fix the probes;
    aligning the probes using a guide supporting plate having grooves, wherein the aligning of the probes includes inserting guide supports of the plugs into the grooves of the guide supporting plate; and
    inserting the plugs of the aligned probes into the jointing grooves.

* * * * *